United States Patent
Mallard

(10) Patent No.: US 10,431,360 B2
(45) Date of Patent: Oct. 1, 2019

(54) BALANCED MAGNETIC ARRAY

(71) Applicant: Apple Inc., Cupertino, CA (US)

(72) Inventor: David F. Mallard, Mill Valley, CA (US)

(73) Assignee: Apple Inc., Cupertino, CA (US)

( * ) Notice: Subject to any disclaimer, the term of this patent is extended or adjusted under 35 U.S.C. 154(b) by 331 days.

(21) Appl. No.: 15/267,079

(22) Filed: Sep. 15, 2016

(65) Prior Publication Data

US 2017/0092402 A1 Mar. 30, 2017

Related U.S. Application Data

(60) Provisional application No. 62/233,159, filed on Sep. 25, 2015.

(51) Int. Cl.
*H01F 7/02* (2006.01)
*H05K 5/03* (2006.01)

(52) U.S. Cl.
CPC ............ *H01F 7/0242* (2013.01); *H05K 5/03* (2013.01)

(58) Field of Classification Search
CPC .................. H01F 7/0242; H05K 5/03
See application file for complete search history.

(56) References Cited

U.S. PATENT DOCUMENTS

| | | | |
|---|---|---|---|
| 6,060,969 A * | 5/2000 | Hufgard | H03K 17/97 324/207.21 |
| 8,138,869 B1 | 3/2012 | Lauder et al. | |
| 8,841,981 B2 * | 9/2014 | Fullerton | E05C 19/16 335/306 |
| 8,953,310 B2 | 2/2015 | Smith et al. | |
| 9,857,835 B2 * | 1/2018 | Sun | G06F 1/1626 |
| 2007/0138806 A1 * | 6/2007 | Ligtenberg | E05C 19/16 292/251.5 |
| 2009/0051174 A1 * | 2/2009 | Ho | E05C 1/10 292/251.5 |
| 2009/0278642 A1 * | 11/2009 | Fullerton | G01D 18/00 335/284 |
| 2009/0295521 A1 * | 12/2009 | Fullerton | G01D 18/00 335/306 |
| 2011/0018663 A1 * | 1/2011 | Fullerton | H01F 7/0242 335/302 |
| 2011/0136552 A1 * | 6/2011 | Lee | H04M 1/0245 455/575.3 |
| 2012/0068942 A1 * | 3/2012 | Lauder | H01F 7/04 345/173 |
| 2012/0233835 A1 | 9/2012 | Tolentino | |
| 2012/0256715 A1 * | 10/2012 | Fullerton | H01F 7/021 335/285 |
| 2012/0306604 A1 * | 12/2012 | Fullerton | B42F 1/00 335/306 |
| 2013/0076614 A1 * | 3/2013 | Ive | G06F 1/1677 345/156 |
| 2013/0285365 A1 * | 10/2013 | Davis | F16L 37/004 285/9.1 |

(Continued)

*Primary Examiner* — Mohamad A Musleh
(74) *Attorney, Agent, or Firm* — Dickinson Wright RLLP

(57) ABSTRACT

A consumer electronic device is disclosed that includes at least the following elements: a housing and magnets carried by the housing that form magnetic circuits with corresponding magnets carried by an accessory device. The magnetic circuits taken together (i) magnetically attach the housing to the accessory device, and (ii) have a net zero, or near net zero, torque.

12 Claims, 6 Drawing Sheets

(56) References Cited

U.S. PATENT DOCUMENTS

| | | | | |
|---|---|---|---|---|
| 2013/0328914 A1* | 12/2013 | Smith | ................. | G06F 3/01 |
| | | | | 345/619 |
| 2013/0328917 A1* | 12/2013 | Zambetti | ............. | G06F 1/1626 |
| | | | | 345/620 |
| 2017/0352459 A1* | 12/2017 | Scales | ................ | H01F 7/021 |

* cited by examiner

BALANCED MAGNETIC ARRAY

CROSS-REFERENCE TO RELATED APPLICATIONS

The present application claims the benefit of U.S. Provisional Application No. 62/233,159, entitled "BALANCED MAGNETIC ARRAY" filed Sep. 25, 2015, the content of which is incorporated herein by reference in its entirety for all purposes.

FIELD

The described embodiments relate generally to optimizing positions for magnetic arrays. More particularly, the present embodiments relate to arranging arrays of magnets so that there is a net zero torque is between two magnetic arrays.

BACKGROUND

Conventional attachment techniques generally rely upon mechanical fasteners that typically require at least an externally accessible attaching feature on the electronic device to mate with a corresponding attaching feature on the accessory device. The presence of the external attaching feature can detract from the overall look and feel of the handheld computing device as well as add unwanted weight and complexity as well as degrade the appearance of the hand held computing device.

Magnets and magnetic arrays are increasingly being relied upon to magnetically attach objects. In particular, consumer electronic products are using magnetic arrays to magnetically attach such objects as accessory devices, connectors, and the like.

SUMMARY

This paper describes various embodiments that relate to designing arrays of magnets that develop a net zero, or near net zero, torque when magnetically coupled together.

A consumer electronic device is described. The consumer electronic product includes a housing and first magnet elements carried by the housing that form magnetic circuits with corresponding second magnetic elements carried by an accessory device, such that the magnetic circuits taken together have a net zero, or near net zero, torque value.

A consumer product system includes a consumer electronic product that includes housing, and first magnetic elements carried by the housing and a pinning magnet having a magnetic property and separate from the first magnetic elements and an accessory device capable of being magnetically coupled to the consumer electronic product and including an accessory body arranged to carry second magnetic elements capable of forming magnetic circuits with corresponding first magnetic elements carried by the housing. The magnetic circuits provide a net torque value of about zero and a net force value corresponding to the magnetic property of the pinning magnet.

A method for a primary and a secondary magnetic array each having corresponding sub-groups of magnets, the primary magnetic array further including a pinning magnet having a magnetic property is carried out for each magnetic sub-group. The method includes at least the following operations: adjusting a magnetic property of a first sub-group of the primary magnetic array and a magnetic property of the second sub-group of the secondary magnetic array such that a net magnetic torque between the first and second sub-groups is a net zero value such that a magnetic attraction between the first and second magnetic arrays corresponds to the magnetic property of the pinning magnet.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
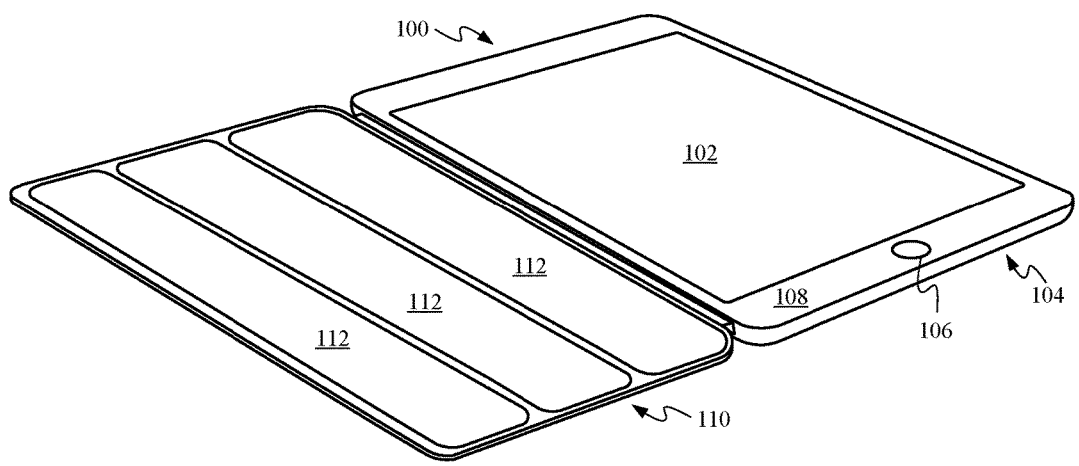
FIG. 1 shows an exemplary device suitable for use with the described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The following describes embodiments related to magnetic attachment. In particular, magnetic attachment between objects in a manner that the objects are joined in a seamless manner and in a primary orientation and spatial arrangement. In some embodiments, the objects can take the form of a host electronic device and an accessory device that can be used to protect and/or enhance operability of the electronic device. In some embodiments, the host electronic device can rely upon multiple magnetic attachment features for coupling to another device. When the attachment features are brought into proximity with magnetic attachment points of another device, the magnetic fields can cooperatively interact based upon their respective properties and result in the devices magnetically attaching to each other in a desired and repeatable manner. For example, due at least in part to the cooperative nature of the interaction of the magnetic fields, the objects can attach to each other in a pre-determined position and relative orientation without external intervention. For example, the cooperative magnetic interaction can result in the objects self-aligning and self-centering in a desired orientation without external intervention so that a position of the devices with respect to one another is assured. When this type of coupling allows the devices to move with respect to one another, an intensity of the magnetic field emitted by one device changes or shifts in the other device. By shaping the magnetic field as described briefly above, the magnetic field can be laid out so that one or more magnetically sensitive components experience little or no effect from the emitted magnetic field for common configurations of the device. For example, the magnetic field can be arranged so that in both a fully open and fully closed position, a particular magnetically sensitive component experiences little or no effect from the magnetic field.

However, as the number and complexity of magnets increases, undesirable magnetic interactions can occur between magnets that adversely affect an overall magnetic attraction. For example, a magnetic array carried by an accessory device used to magnetically attract the accessory device to a host device can have a magnetic interaction with other magnetic arrays carried by the accessory device. This unwanted magnetic interaction can create issues related to proper alignment of the accessory device and the host device.

Therefore, the described embodiments describe technique to reduce unwanted magnetic interaction between magnetic arrays carried by an object (in this case an accessory device) and as a result improve an overall magnetic attraction. In one embodiment, a primary magnetic array is selected and based upon the selected magnetic array. Then a determination is made with respect other magnetic arrays carried by the accessory device. In one embodiment, the other magnetic array has a magnetic pattern (formed of magnetic polarity, strength, etc.) that prevents most of the unwanted magnetic interaction. In one embodiment, the magnetic arrays can be pinned such that a desired amount of attraction is created. For example, if ends of the two arrays are determined to be attracted (i.e., pinned), that a remainder part of the arrays can be balanced using the described embodiments.

In order to assure that the magnetic attachment between the host electronic device and the accessory device is secure, magnets in the host electronic device and the accessory device can form magnetic circuits. In a particular embodiment, the magnetic circuits can combine to form an overall magnetic attractive force and a net zero, or near net zero, torque value. In other words, the overall torque value of the magnetic attachment can make to be about zero by torque adjusting magnetic properties of magnetic components used to form individual magnetic circuits. In one embodiment, a first magnetic circuit is torque balanced by adjusting magnetic properties such as polarity, size, and magnetic strength. By balancing a torque between opposing magnetic components in an iterative manner, an overall torque value can become close to zero. In this way, the overall magnetic attraction can be more stable and less prone to inadvertent release.

The devices can take many forms and perform many functions. In one embodiment, at least one device can take the form of an accessory device. The accessory device can be magnetically attached to at least one electronic device having a relatively large display in proportion to the overall size of the electronic device (a tablet device is one example). The accessory device can provide services and functions that can be used to enhance the operability of the electronic device. For example, the accessory device can take the form of a protective cover that can be magnetically attached to the electronic device. The protective cover can provide protection to certain aspects (such as a display) of the electronic device while enhancing the overall look and feel of the electronic device. The protective cover can also provide support features that enhance a user interaction with the electronic device. For example, the protective cover can be folded into a shape(s) that can support the electronic device in a various display modes. One such display mode can position the display at an angle with respect to a horizontal support surface that is optimal for presentation of video content by the display.

The protective cover can include at least a flexible hinge portion. The flexible hinge portion can include a flexible body that, in turn, incorporates a magnetic attachment mechanism that can include a number of magnets. A magnetic field provided by the magnets can interact with a corresponding magnetic field provided by magnets in the electronic device to magnetically attach the protective cover and the electronic device in a specific orientation and relative position. In other words, the magnetic attachment mechanism can provide both coarse and fine alignment between the protective cover and the electronic device. The protective cover can include a flap that is connected to the flexible hinge portion arranged to smoothly rotate about a pivot line. In one embodiment, the flap can rotate 180° in a first direction towards the display and can rotate 180° in second direction opposite the first direction away from the display.

These and other embodiments are discussed below with reference to FIGS. 1-6; however, those skilled in the art will readily appreciate that the detailed description given herein with respect to these figures is for explanatory purposes only and should not be construed as limiting.

FIG. 1 shows an exemplary electronic device 100. As depicted, electronic device 100 can take the form of a tablet device. In some embodiments, electronic device 100 can include display assembly 102 positioned within a housing 104. Housing 104 can be formed of any number of substantially rigid materials along the lines of aluminum, plastic, or steel and can provide protection for various internal components disposed within housing 104. In some embodiments, electronic device can include any number of user interface elements including for example button 106 that extends through protective cover 108, which overlays and provides protection for display assembly 102. In some embodiments, display assembly 102 can provide another means of controlling and manipulating content presented by electronic device 100. For example, a touch sensitive sensor can overlay display assembly 102 and allow a user of electronic device to directly manipulate objects appearing upon display assembly 102. Electronic device 100 can include various other features such as additional buttons and switches as well as I/O ports for interacting and exchanging data with electronic device 100 and other electronic devices or peripherals.

FIG. 1 depicts accessory device 110 which can be pivotally coupled with electronic device 100 to take the form of a consumer electronic product. In some embodiments, electronic device 100 can be coupled to accessory device 110 by way of a number of magnets. In some embodiments, accessory device can take the form of a flexible flap having a number of segments 112 that assist in shaping the accessory device into any one of a number of support configurations.

For example, accessory device 110 can be arranged in a triangular formation to support electronic device 100 in various orientations. In some embodiments, at least a portion of accessory device 110 can be covered with a cosmetic layer of fabric. Segments 112 can also be configured to allow a user of electronic device 100 to uncover a predetermined amount of display assembly 102. For example, when accessory device 110 completely overlays protective cover 108, folding back a first one of rigid segments 112 can uncover a small amount of display assembly 102. Furthermore, folding back two of rigid segments 112 can expose even more of display assembly 102. In some embodiments, electronic device 100 can be configured to display content only on those portions of display assembly 102 that are uncovered.

Figure 2:
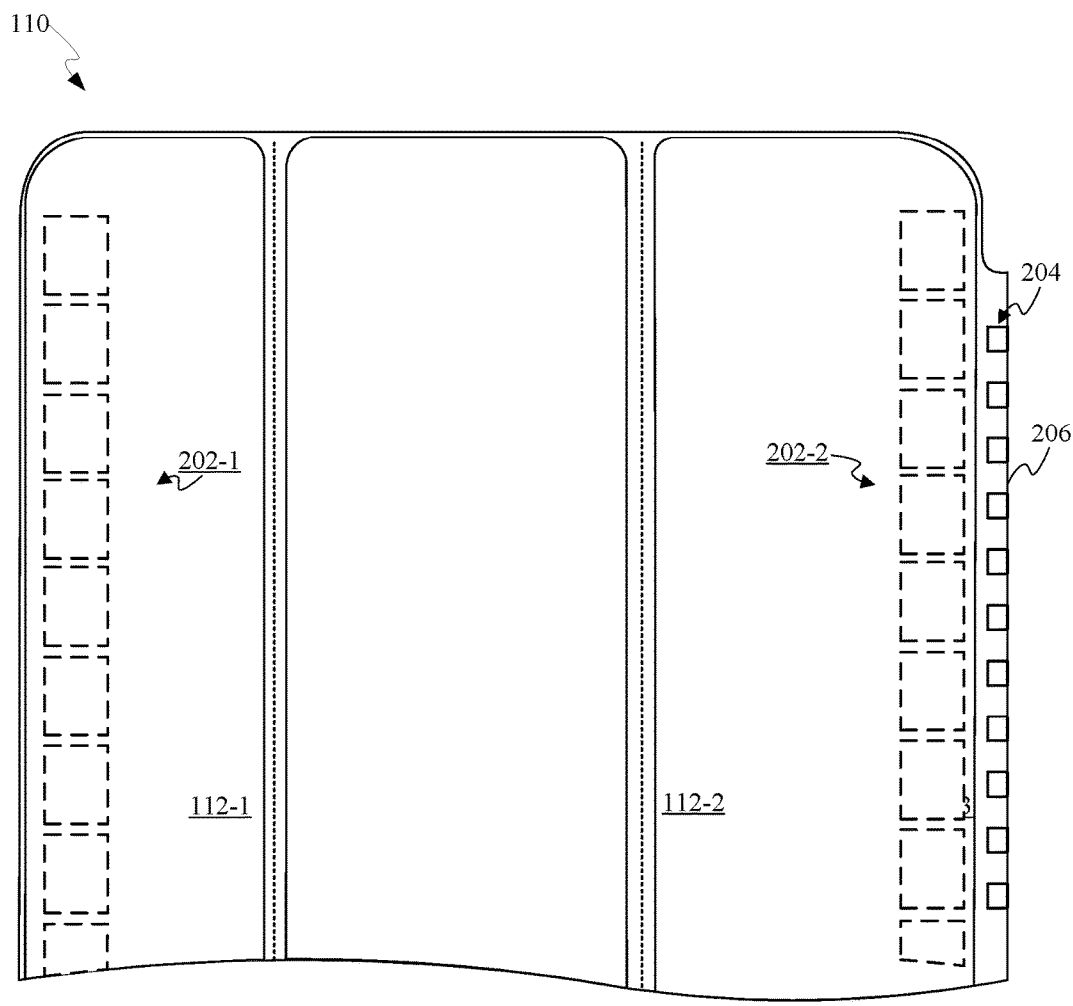
FIG. 2 shows an upper portion of an accessory device with a magnetic string disposed therein.

FIG. 2 shows a close up view of an upper portion of accessory device 110. In particular, FIG. 2 shows how a group of magnets 202 (indicated by solid rectangular boxes) can be arranged within accessory device 110. In some embodiments, the magnetic field emitted by magnets 202 can be operable to secure a portion of accessory device 110 surrounding segment 112-1 against protective cover 108. Magnets 202 can be arranged in a magnetic string formation in which each of magnets are linearly disposed with respect to one another. For example, some of magnets 202 can be shifted laterally to optimize a shape and/or size of the magnetic field emitted by magnets 202. In some embodiment, a magnetic field emitted by magnets 202 can be customized by the way magnets 202 are magnetized. In some embodiments, magnets 202 can be arranged in such a way that the individual magnetic elements can be arranged in an alternating magnetic polarity pattern (P1, P2, P1, P2 . . . ; where P1 represents a first polarity such as North and P2 represents a second polarity opposite that of P1 such as South). While FIG. 2 shows the individual magnets 202 to be equally spaced apart, the spacing between the individual magnets can vary. In some cases, as in the depiction of FIG. 2 the individual magnets 202 can be characterized as having about the same size, shape and mass. In other cases, the individual magnetic elements can vary in size, shape and mass or any combination thereof.

In some embodiments, magnets 202 can form magnetic circuits that can secure segments 112 in such a way so as to assist in shaping accessory device 110 into any one of a number of support configurations. For example, a triangular support structure can be formed when segment 112-1 folds about hinge line 120-1 thereby placing magnets 202-1 in proximity to magnets 202-2 carried by segment 112-2 allowing magnetic circuits to form. In this way, the magnetic circuits provide a retaining force that maintains accessory device 110 in the desired triangular shape.

However, as the size of accessory device 110 reduces, distances between magnets carried by accessory device 110 can start to interfere with each other and as a result create undesired magnetic interactions. For example, accessory device 110 can be magnetically attached to electronic device 100 using attachment magnets 204 carried by flap 206. However, when attachment magnets 204 form a magnetic attachment to corresponding magnets carried by electronic device 110, a "parasitic" magnetic interaction between attachment magnets 204 and edge attach magnets 202-1 can be enhanced. This enhanced magnetic interaction can result in reduced magnetic attraction between electronic device 100 and accessory device 110 as well as undesired effects related to magnetically induced torque.

Accordingly, the embodiments described herein relate to techniques that reduce these unwanted effects by selectively designing magnetic arrays in accordance with a desired magnetic torque and/or force at a particular location. For example, referring again to FIG. 2, magnetic array 204 can be considered a primary magnetic array carried by accessory device 110 and magnetic array 202-2 can be considered to be a secondary magnetic that can be configured (or tuned) to interact with magnetic array 204 in a pre-determined manner.

Figure 3:
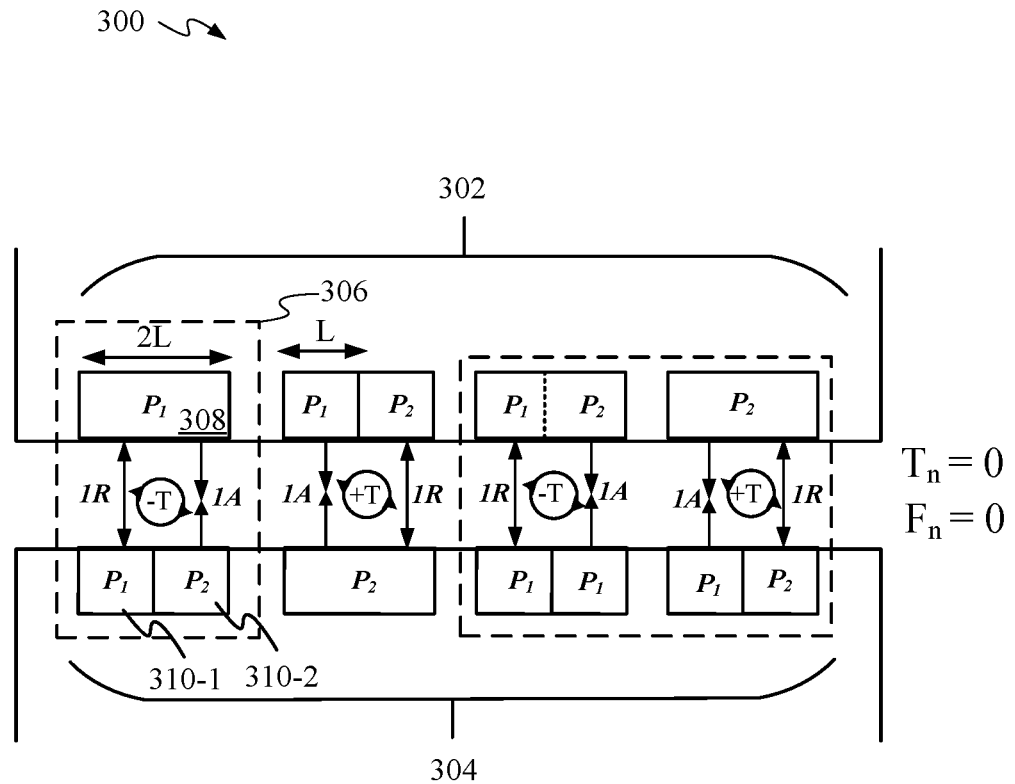
FIG. 3 shows balanced magnetic system in accordance with the described embodiments.

FIG. 3 shows balanced magnetic system 300 in accordance with the described embodiments. It should be noted that magnetic system 300 can be tuned in such a way that a magnetic interaction between (primary) magnetic array 302 and (secondary) magnetic array 304 can be characterized as any of the following: lightly/strongly attract, lightly/strongly repel, no interaction at a particular position. In the example shown in FIG. 3, secondary magnetic array 304 is balanced in accordance with a "no interaction" scenario. Magnetic array 304 can be balanced in one embodiment by evaluating a magnetic force value and a magnetic torque value for a sub-set of magnets. For example, sub-set 306 can include magnet 308 having a length of 2 L (where L is a unit length) and a magnetic polarity of P1 (it should be noted that from a magnetic torque/force analysis a single magnet of length 2 L is equivalent to 2 magnets of length L of the same polarity side by side). Corresponding magnets 310 in magnetic array 304 can have properties chosen to provide null magnetic torque T and a null magnetic force F by selecting magnet 310-1 to have unit length L and magnetic polarity P1 creating a first magnetic circuit corresponding to a net repulsive force of −1 R whereas magnet 310-2 can have magnetic properties corresponding to a unit length of L and a magnetic polarity of P2. In this way the second magnetic circuit corresponds to a net attractive magnetic force +1A. Overall, by adding the magnetic circuits of sub-group 306 results in an overall null torque value T and an overall null magnetic force F. This process can be repeated iteratively for all of magnetic array 304 in order to arrive at a desired magnetic interaction between magnetic array 302 and 304. In the example of FIG. 3, magnetic array 302 and 304 are fully balanced in that the magnetic interaction corresponds to null magnetic force F and null magnetic torque T.

Figure 4:
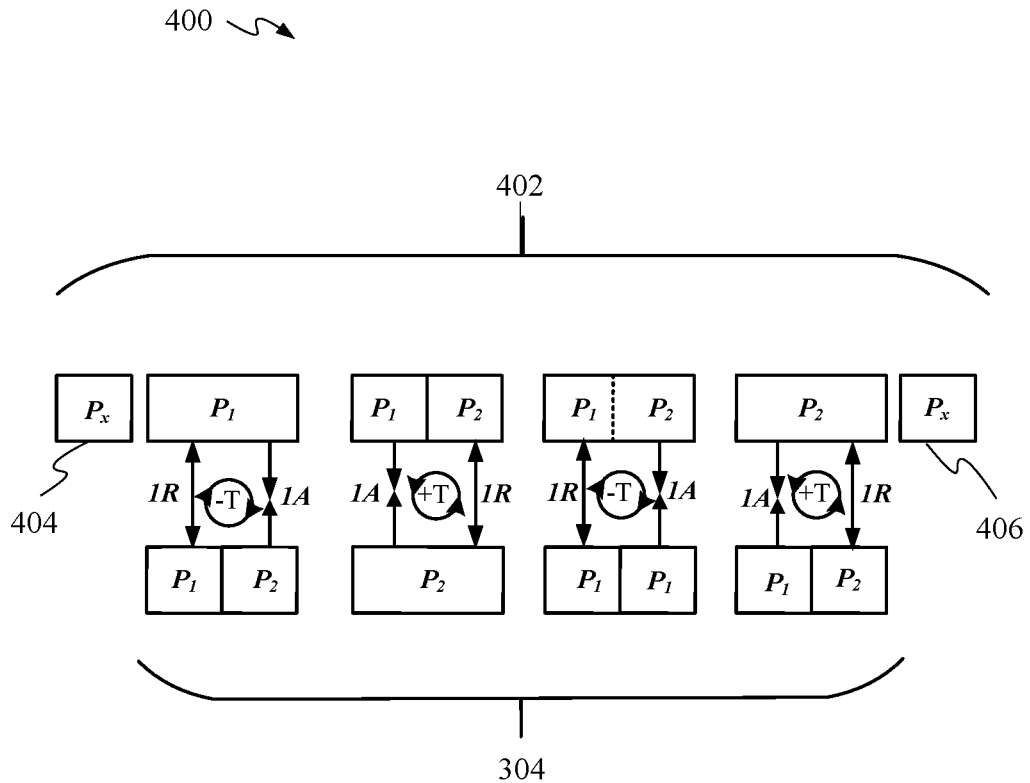
FIG. 4 shows balanced magnetic system of FIG. 3 pinned with pinning magnets.

However, FIG. 4 illustrates magnetic system 400 having magnetic array 402 augmented with "pinning" magnets 404 and 406 that result in the interaction of magnetic array 402 and 304 characterized as being a net attractor or repulsor depending upon the magnetic properties of pinning magnets 404 and 406. For example, magnetic elements 402 and 404 can have a unit length that when added to magnetic array 402, the interaction with magnetic array 304 can be characterized as having a net attractive force of +2F and null magnetic torque T.

Figure 5:
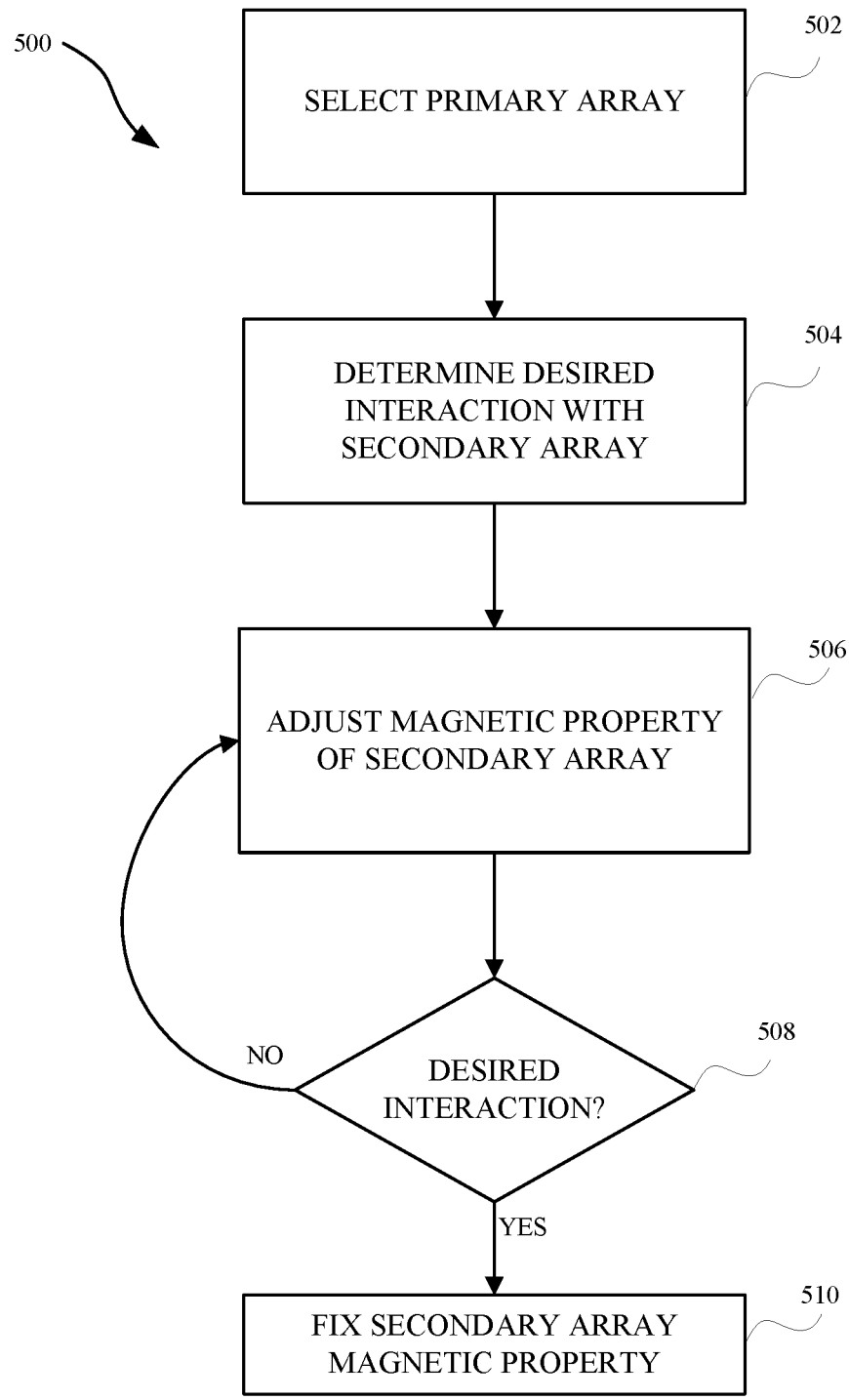
FIG. 5 shows a flowchart detailing a process in accordance with the described embodiments.

FIG. 5 shows a flowchart detailing process 500 in accordance with the described embodiments. At 502, a primary magnetic array is selected. At 504, a desired interaction between the primary magnetic array and a secondary magnetic array is determined. The desired magnetic interaction can be any of the following: lightly/strongly attract, lightly/strongly repel, no interaction at a particular position. At 506, a magnetic property of the second magnetic array is adjusted and a determination is made at 508 if the desired interaction is achieved. If the desired interaction is not achieved then control is passed back to 504, otherwise the configuration of the secondary magnetic array is set at 510.

Figure 6:
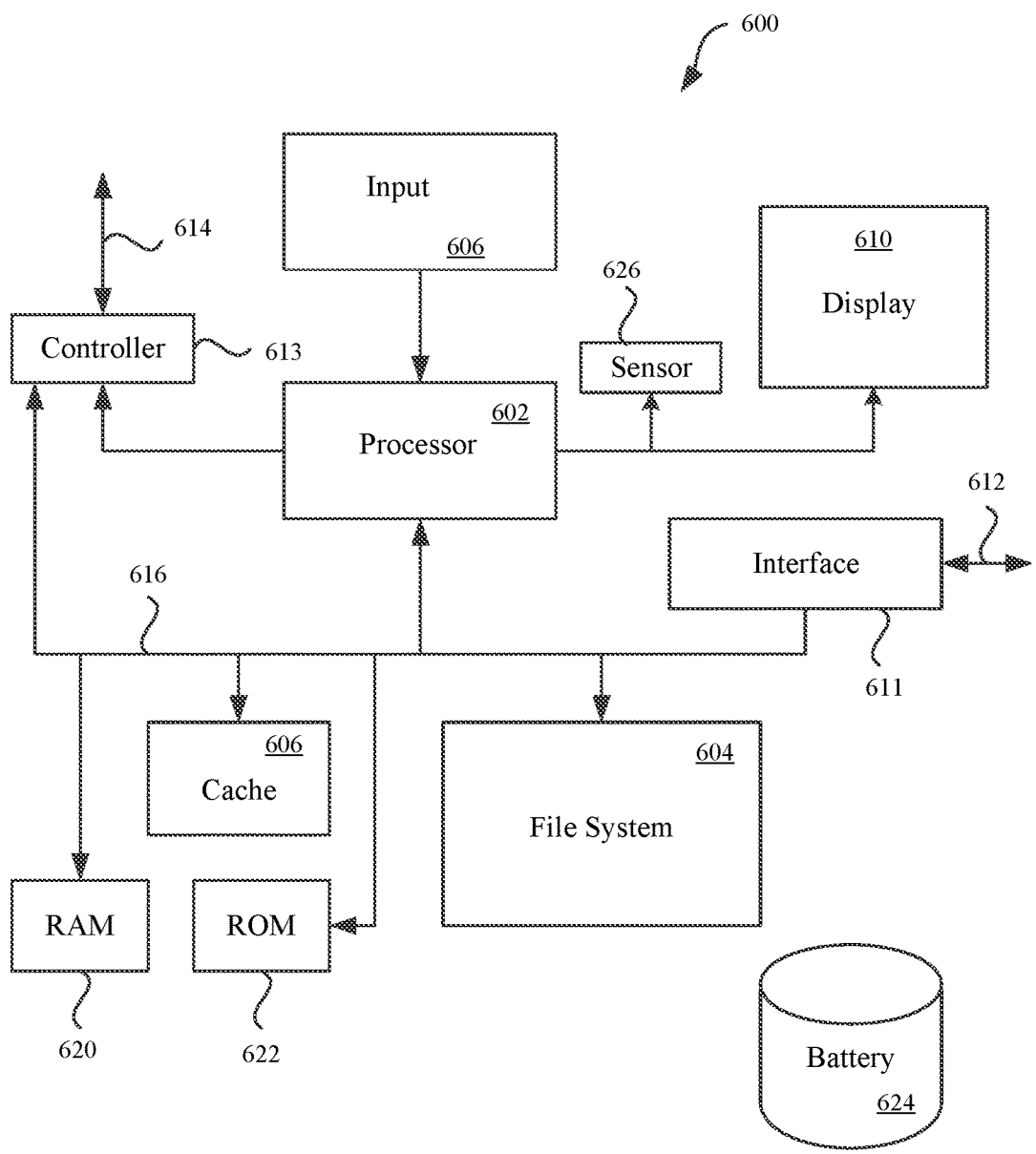
FIG. 6 is a block diagram of an electronic device suitable for controlling some of the processes in the described embodiment.

FIG. 6 is a block diagram of an electronic device suitable for controlling some of the processes in the described embodiment. Electronic device 600 can illustrate circuitry of a representative computing device. Electronic device 600 can include a processor 602 that pertains to a microprocessor or controller for controlling the overall operation of electronic device 600. Electronic device 600 can include instruction data pertaining to operating instructions in a file system 604 and a cache 606. File system 604 can be a storage disk or a plurality of disks. In some embodiments, file system 604 can be flash memory, semiconductor (solid state) memory or the like. The file system 604 can typically provide high capacity storage capability for the electronic device 600. However, since the access time to the file system 604 can be relatively slow, the electronic device 600 can also include cache 606. The cache 606 can include, for example, Random-Access Memory (RAM) provided by semiconductor memory. The relative access time to the cache 606 can substantially shorter than for the file system 604. However, cache 606 may not have the large storage capacity of file system 604. Further, file system 604, when active, can consume more power than cache 606. Power consumption often can be a concern when the electronic device 600 is a portable device that is powered by battery 624. The electronic device 600 can also include a RAM 620 and a Read-Only Memory (ROM) 622. The ROM 622 can store programs, utilities or processes to be executed in a non-volatile manner. The RAM 620 can provide volatile data storage, such as for cache 606.

Electronic device 600 can also include user input device 608 that allows a user of the electronic device 600 to interact with the electronic device 600. For example, user input device 608 can take a variety of forms, such as a button, keypad, dial, touch screen, audio input interface, visual/image capture input interface, input in the form of sensor data, etc. Still further, electronic device 600 can include a display 610 (screen display) that can be controlled by processor 602 to display information to the user. Data bus 616 can facilitate data transfer between at least file system 604, cache 606, processor 602, and controller 613. Controller 613 can be used to interface with and control different manufacturing equipment through equipment control bus 614. For example, control bus 614 can be used to control a computer numerical control (CNC) mill, a press, or other display devices. For example, processor 602, upon a certain manufacturing event occurring, can supply instructions to control an alternate display through controller 613 and control bus 614. Such instructions can be stored in file system 604, RAM 620, ROM 622 or cache 606.

Electronic device 600 can also include a network/bus interface 611 that couples to data link 612. Data link 612 can allow electronic device 600 to couple to a host computer or to accessory devices. The data link 612 can be provided over a wired connection or a wireless connection. In the case of a wireless connection, network/bus interface 611 can include a wireless transceiver. Sensor 626 can take the form of circuitry for detecting any number of stimuli. For example, sensor 626 can include any number of sensors for monitoring such as, for example, a Hall Effect sensor responsive to external magnetic field, an audio sensor, a light sensor such as a photometer and so on.

A consumer electronic device is described. The consumer electronic product includes a housing and first magnet elements carried by the housing that form magnetic circuits with corresponding second magnetic elements carried by an accessory device, wherein the magnetic circuits taken together have a net zero, or near net zero, torque value. In one embodiment, the consumer electronic product further includes a pinning magnetic element carried by the housing, the pinning magnetic element having a magnetic property. In one embodiment, the magnetic circuits taken together with the pinning magnetic element further comprise a net non-zero attraction force corresponding to the magnetic property. In one embodiment, the net non-zero attraction force provided by the pinning magnetic element magnetically attaches the housing to the accessory device. In one embodiment, the first magnetic elements carried by the housing and the corresponding second magnetic elements carried by the accessory device are arranged in magnetic diads. In one embodiment, the first magnetic elements carried by the housing comprise a first magnetic polarity pattern. In one embodiment, the corresponding second magnetic elements carried by the accessory device comprise a second polarity pattern that is different than the first polarity pattern. In one embodiment, the first and the second polarity patterns result in a net zero, or near net zero, force value between the first magnetic elements carried by the housing and the corresponding second magnetic elements carried by the accessory device. In one embodiment, a first magnetic diad includes a first magnetic element carried by the housing, the first magnetic element includes a first magnet having a length 2 L and having a first polarity, the first magnetic diad also includes a corresponding second magnetic element carried by the accessory device including a first magnet having a length L and the first polarity and a second magnet having the length L and a second polarity opposite the first polarity.

A consumer product system includes a consumer electronic product comprising: a housing, and first magnetic elements carried by the housing and a pinning magnet having a magnetic property and separate from the first magnetic elements and an accessory device capable of being magnetically coupled to the consumer electronic product and comprising an accessory body arranged to carry second magnetic elements capable of forming magnetic circuits with corresponding first magnetic elements carried by the housing, wherein the magnetic circuits comprise a net torque value of about zero and a net force value corresponding to the magnetic property of the pinning magnet. In one embodiment, the magnetic circuits taken together further comprise a net zero attraction force. In one embodiment, the first magnetic elements carried by the housing and the corresponding second magnets carried by the accessory device are arranged in magnetic diads. In one embodiment, the first magnetic elements carried by the housing comprise a first magnetic polarity pattern. In one embodiment, the corresponding second magnetic elements carried by the accessory device comprise a second polarity pattern different than the first polarity pattern.

A method for a primary and a secondary magnetic array each having corresponding sub-groups of magnets, the primary magnetic array further including a pinning magnet having a magnetic property is carried out for each magnetic sub-group. The method includes at least the following operations: adjusting a magnetic property of a first sub-group of the primary magnetic array and a magnetic property of the second sub-group of the secondary magnetic array such that a net magnetic torque between the first and second sub-groups is a net zero value such that a magnetic attraction between the first and second magnetic arrays corresponds to the magnetic property of the pinning magnet. In one embodiment, the adjusting is carried out for all sub-groups. In one embodiment, the net magnetic torque corresponds to a summation of the magnetic torques of each of the sub-groups. In one embodiment, the corresponding sub-groups form magnetic diads. In one embodiment, each of the magnetic diads provide a net zero magnetic torque. In one embodiment, each of the magnetic diads corresponds to a net zero magnetic force.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A consumer electronic device, comprising:
a housing that carries a first array of magnetic elements that include a pinning magnet and first magnetic attachment elements, each of the first magnetic attachment elements is limited to forming a magnetic circuit with a corresponding second magnetic attachment element carried by an accessory device, and
wherein the pinning magnet has a length that alters a magnetic property of the magnetic circuits such that the magnetic circuits taken together have a net zero torque or a near net zero torque value, and a net non-zero attraction force.

2. The consumer electronic device as recited in claim 1, wherein the net non-zero attraction force provided by the pinning magnet magnetically attaches the housing to the accessory device.

3. The consumer electronic device as recited in claim 1, wherein the first magnetic attachment elements carried by the housing and the corresponding second magnetic attachment elements carried by the accessory device are arranged in magnetic diads.

4. The consumer electronic device as recited in claim 1, wherein the first magnetic attachment elements carried by the housing comprise a first magnetic polarity pattern.

5. The consumer electronic device as recited in claim 4, wherein the corresponding second magnetic attachment elements carried by the accessory device comprise a second polarity pattern that is different than the first polarity pattern.

6. The consumer electronic device as recited in claim 5, wherein the first and the second polarity patterns result in a net zero attraction force or near net zero attraction force value between the first magnetic attachment elements carried by the housing and the corresponding second magnetic attachment elements carried by the accessory device.

7. The consumer electronic device as recited in claim 3, wherein a first magnetic diad comprises a first magnetic attachment element carried by the housing, the first magnetic attachment element comprising a first magnet having a length 2L and having a first polarity, the first magnetic diad further comprising the corresponding second magnetic element carried by the accessory device comprising a first magnet having a length L and the first polarity and a second magnet having the length L and a second polarity opposite the first polarity.

8. A consumer product system, comprising:
a consumer electronic product comprising: a housing that carries a first array of magnetic elements that includes a pinning magnet and first magnetic attachment elements; and
an accessory device capable of being magnetically coupled to the consumer electronic product and comprising a second array of magnetic elements that includes second magnetic attachment elements, wherein each of the first magnetic attachment elements are limited to forming a magnetic circuit with a corresponding second magnetic attachment element of the accessory device,
wherein the pinning magnet has a length that alters a magnetic property of the magnetic circuits such that the magnetic circuits taken together have a net zero torque value or a near net zero torque value, and a net force value corresponding to the magnetic property of the pinning magnet.

9. The consumer product system as recited in claim 8, wherein the magnetic circuits taken together further comprise a net non-zero attraction force.

10. The consumer product system as recited in claim 8, wherein the first magnetic attachment elements carried by the housing and the corresponding second magnetic attachment elements carried by the accessory device are arranged in magnetic diads.

11. The consumer product system as recited in claim 8, wherein the first magnetic attachment elements carried by the housing comprise a first magnetic polarity pattern.

12. The consumer electronic product as recited in claim 11, and the corresponding second magnetic attachment elements carried by the accessory device comprise a second polarity pattern different than the first polarity pattern.

* * * * *